(12) United States Patent
Kamikawa et al.

(10) Patent No.: US 7,692,200 B2
(45) Date of Patent: Apr. 6, 2010

(54) NITRIDE SEMICONDUCTOR LIGHT-EMITTING DEVICE

(75) Inventors: Takeshi Kamikawa, Mihara (JP); Yoshika Kaneko, Hunabashi (JP); Kensaku Motoki, Itami (JP)

(73) Assignees: Sharp Kabushiki Kaisha, Osaka (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/314,062

(22) Filed: Dec. 3, 2008

(65) Prior Publication Data

US 2009/0092166 A1 Apr. 9, 2009

Related U.S. Application Data

(62) Division of application No. 10/554,991, filed as application No. PCT/JP2004/007681 on May 27, 2004.

(30) Foreign Application Priority Data

May 30, 2003 (JP) .............................. 2003-153621

(51) Int. Cl.
*H01L 33/00* (2006.01)
(52) U.S. Cl. ............................ 257/79; 257/94; 257/103; 257/E21.108; 257/E33.001; 257/E33.002; 257/E33.013; 257/E33.043; 372/43.01; 372/45.01; 372/50.1; 438/42; 438/43; 438/44; 438/46; 438/47
(58) Field of Classification Search ............... 257/94, 257/103, 79, E21.108, E33.001, E33.013, 257/E33.043, E33.002; 372/43.01, 50.1, 372/45.01; 438/42–44, 46, 47
See application file for complete search history.

(56) References Cited

U.S. PATENT DOCUMENTS 6,044,098 A * 3/2000 Sun ..................... 372/46.013

(Continued)

FOREIGN PATENT DOCUMENTS

JP 10-312971 11/1998

(Continued)

OTHER PUBLICATIONS

Shuji Nakamura et al., "InGaN/GaN/AlGaN-based laser diodes with cleaved facets grown on GaN substrates", Applied Physics Letters, American Institute of Physics, vol. 73, No. 6 (Aug. 10, 1998).

(Continued)

*Primary Examiner*—Wael Fahmy
*Assistant Examiner*—Hrayr A Sayadian
(74) *Attorney, Agent, or Firm*—Harness, Dickey & Pierce, P.L.C.

(57) ABSTRACT

A nitride semiconductor light-emitting device wherein a substrate or nitride semiconductor layer has a defect concentration region and a low defect density region other than the defect concentration region. A portion including the defect concentration region of the nitride semiconductor layer or substrate has a trench region deeper than the low defect density region. Thus by digging the trench in the defect concentration region, the growth detection is uniformized, and the surface planarity is improved. The uniformity of the characteristic in the wafer surface leads to improvement of the yield.

2 Claims, 9 Drawing Sheets

U.S. PATENT DOCUMENTS

| | | |
|---|---|---|
| 6,350,316 B1 | 2/2002 | Hayashi et al. |
| 6,812,496 B2 * | 11/2004 | Takatani et al. ............... 257/79 |
| 6,815,728 B2 * | 11/2004 | Tsuda et al. ................... 257/98 |
| 6,984,841 B2 | 1/2006 | Tsuda et al. |
| 7,498,608 B2 * | 3/2009 | Ito et al. ........................ 257/98 |
| 2001/0003019 A1 | 6/2001 | Morita |
| 2002/0034204 A1 * | 3/2002 | Iwamoto et al. ............... 372/46 |
| 2003/0132441 A1 * | 7/2003 | Takatani et al. ............... 257/79 |
| 2004/0041156 A1 * | 3/2004 | Tsuda et al. ................... 257/79 |

FOREIGN PATENT DOCUMENTS

| | | |
|---|---|---|
| JP | 2001-102307 | 4/2001 |
| JP | 2001-158698 | 6/2001 |
| JP | 2002-217115 | 8/2002 |
| JP | 2002-246694 | 8/2002 |
| JP | 2002-319733 | 10/2002 |
| JP | 2003-133650 | 5/2003 |

OTHER PUBLICATIONS

International Search Report.

* cited by examiner (a)          (b)

NITRIDE SEMICONDUCTOR LIGHT-EMITTING DEVICE

PRIORITY STATEMENT

This application is a divisional application of U.S. application Ser. No. 10/554,991 (filed Nov. 1, 2005), which is a national phase of PCT Application No. PCT/JP2004/007681 (filed May 27, 2004). PCT Application No. PCT/JP2004/007681 claims priority to Japanese Patent Application No. 2003-153621 (filed May 30, 2003). The entire contents of U.S. application Ser. No. 10/554,991, PCT Application No. PCT/JP2004/007681 and Japanese Patent Application No. 2003-153621 are incorporated herein by reference.

TECHNICAL FIELD

The present invention relates to a nitride semiconductor light-emitting device such as a nitride semiconductor laser device.

BACKGROUND ART

There have been fabricated prototypes of semiconductor laser devices that oscillate in a region ranging from ultraviolet to visible light by the use of a nitride semiconductor material as exemplified by GaN, AlN, InN, and composite crystals thereof. For such purposes, GaN substrates are typically used, and therefore they have been intensively researched by a host of research-and-development institutions. At the moment, however, no semiconductor laser devices offer satisfactorily long useful lives, and accordingly what is most expected in them is longer useful lives. It is known that the useful life of a semiconductor laser device strongly depends on the density of defects (in the present specification, defects refer to, for example, vacancies, interstitial atoms, and dislocations in a crystal) that are present in a GaN substrate from the beginning. The problem here is that substrates with low defect density, however effective they may be believed to be in achieving longer useful lives, are difficult to obtain, and therefore researches have been eagerly done to achieve as much reduction in defect density as possible.

For example, Non-Patent Reference 1 reports fabricating a GaN substrate by the following procedure. First, on a sapphire substrate, a 2.0 µm thick primer GaN layer is grown by MOCVD (metalorganic chemical vapor deposition). Then, on top of this, a 0.1 µm thick $SiO_2$ mask pattern having regular stripe-shaped openings is formed. Then, further on top, a 20 µm thick GaN layer is formed again by MOCVD. Now, a wafer is obtained. This technology is called ELOG (epitaxially lateral overgrown), which exploits lateral growth to reduce defects.

Further on top, a 200 µm thick GaN layer is formed by HVPE (hydride vapor phase epitaxy), and then the sapphire substrate serving as a primer layer is removed. In this way, a 150 µm thick GaN substrate is produced. Next, the surface of the obtained GaN substrate is ground to be flat. The thus obtained substrate includes, within a substrate surface, a defect-concentrated region and a low-defect region, and, in general, it is classified into a defect-concentrated region including many defects in a part of $SiO_2$ and a low-defect region being all the remaining part of $SiO_2$.

The problems here is, however, that the characteristics of a semiconductor laser device fabricated by growing a nitride semiconductor layer, by a growing process such as MOCVD, on a substrate including a defect-concentrated region and low-defect region vary, resulting in a remarkably low yield rate.

As a result of an intensive research on why the characteristics of a semiconductor laser device fabricated by growing a nitride semiconductor layer, by a growing process such as MOCVD, on a substrate including a defect-concentrated region and low-defect region vary, resulting in a remarkably low yield rate, the applicant of the present invention has found out that this is because poor flatness of the film surface results in poor surface morphology. Specifically, when a nitride semiconductor layer (particularly, an InGaN layer used as an active layer) is grown on an irregular surface of the film, the thickness and composition of the layer vary depending on the surface irregularities of the film, and thus greatly deviate from the set values. Furthermore, the applicant has found out that the poor surface morphology greatly depends on the shape of the defect-concentrated region in the nitride semiconductor layer. That is, the applicant has found out that the growth direction and mode of a thin film strongly depends on the shape of the defect-concentrated region, and therefore the irregularly-shaped defect-concentrated region degrades the flatness of the film surface, leading to poor surface morphology. Growing a thin film such as an active layer on such an irregular surface causes the device characteristics to vary.

These results are obtained in experiments conducted in the following manner. First, a case where a nitride semiconductor layer is grown on a substrate including a defect-concentrated region and a low-defect region will be described. FIG. 16(a) is a sectional view of a conventional semiconductor laser device, and FIG. 16(b) is a top view of FIG. 16A. Reference numeral 10 represents a substrate including a defect-concentrated region and a low-defect region, reference numeral 11 represents a defect-concentrated region, reference numeral 12 represents a low-defect region, reference numeral 13 represents a nitride semiconductor layer, and reference numeral 13a represents a surface of the nitride semiconductor layer.

If a nitride semiconductor layer is grown directly on the substrate 10 (i.e., without performing any preliminary treatment for the substrate, etc.), the growth rate of the defect-concentrated region is greatly different from that of the low-defect region, because the defect-concentrated region has lower crystallinity than the low-defect region and may have a growth surface that does not appear in the low-defect region. As a result, the defect-concentrated region grows at a lower growth rate than the low-defect region, and thus growth hardly occurs in the defect-concentrated region.

FIG. 17(a) is a top view showing how a nitride semiconductor layer having defect-concentrated regions in the shape of lines grows, and FIG. 17(b) is a top view showing how a nitride semiconductor layer having defect-concentrated regions in the shape of dots grows. In either case, since growth hardly occurs in the defect-concentrated regions, growth is started at the defect-concentrated region x and proceeds in the direction indicated by arrow A, and growth is started at the defect-concentrated region y and proceeds in the direction indicated by arrow B. When growth occurs in two different directions in this way, the layer thickness in a growth meet portion becomes different from that elsewhere, leading to poor surface flatness.

FIG. 18 shows measurements of the roughness as measured in the direction [11-20] perpendicular to the line-shaped defect-concentrated region and in the direction [1-100] parallel thereto. The measurements were made by using the "DEKTAK3ST" model manufactured by A SUBSIDIARY OF VEECO INSTRUMENTS INC. The measurement was conducted under the following conditions: measurement length: 600 µm; measurement time: 3 s; probe pressure: 30 mg; and horizontal resolution: 1 µm/sample. The level difference between the highest and lowest parts, within the 600 μm wide region in which the measurement was taken, was found to be 200 nm. Here, the large grooves in the defect-concentrated regions are not considered.

In addition, the growth meet portion was found to be a non-luminous region. Thus, it can be said that the difference in thickness between the layers within a wafer surface causes the device characteristics to vary.

DISCLOSURE OF THE INVENTION

In view of the conventionally encountered problems mentioned above, it is an object of the present invention to provide a nitride semiconductor light-emitting device that offers uniform characteristics within a wafer surface and improves the yield rate.

To achieve the above object, according to one aspect of the present invention, in a nitride semiconductor light-emitting device, a substrate or a nitride semiconductor layer has a defect-concentrated region and a low-defect region corresponding to a region other than the defect-concentrated region, and, in a portion thereof including the defect-concentrated region, an engraved region engraved so as to be located lower than the low-defect region.

In this way, by engraving the defect-concentrated region, the growth direction is made uniform and the surface flatness is improved, offering uniform characteristics within a wafer surface. This makes it possible to improve the yield rate.

In this nitride semiconductor light-emitting device, the defect-concentrated region has the shape of a line or a dot, and the engraved region has the shape of a line. Preferably, the engraving depth of the engraved region is 0.5 μm or more but 50 μm or less. Advisably, it is preferable that the distance from an edge of the engraved region to an edge of the defect-concentrated region is 5 μm or more. Moreover, it is preferable that the nitride semiconductor layer has a ridge portion serving as a laser light waveguide region, and the ridge portion is so formed as to be located 5 μm or more away from an edge of the engraved region.

Moreover, according to another aspect of the present invention, in a nitride semiconductor light-emitting device, a substrate or a nitride semiconductor layer has a defect-concentrated region and a low-defect region corresponding to a region other than the defect-concentrated region, the defect-concentrated region or the low-defect region has a depression, and there is provided an engraved region obtained by engraving a portion including the depression.

In this way, when there is a depression, a portion including the depression is engraved. This makes it possible to achieve uniform growth and improve the surface flatness.

In this nitride semiconductor light-emitting device, it is preferable that the depression measures 0.5 μm or more in depth and 1 μm or more in width. Advisably, it is preferable that the engraving depth of the engraved region is 0.5 μm or more but 50 μm or less. Moreover, it is preferable that the distance from an edge of the engraved region to an edge of the defect-concentrated region is 5 μm or more. Furthermore, it is preferable that the nitride semiconductor layer has a ridge portion serving as a laser light waveguide region, and the ridge portion is so formed as to be located 5 μm or more away from an edge of the engraved region.

Moreover, according to still another aspect of the present invention, in a nitride semiconductor light-emitting device, a substrate or a nitride semiconductor layer has a defect-concentrated region and a low-defect region corresponding to a region other than the defect-concentrated region, the nitride semiconductor layer has a ridge portion serving as a laser light waveguide region, and there is provided, between the ridge portion and the defect-concentrated region, an engraved region engraved so as to be located lower than the low-defect region.

In this way, the engraved region does not necessarily have to be provided in the defect-concentrated region, but may be provided between the ridge portion and the defect-concentrated region to achieve improved surface flatness.

In this nitride semiconductor light-emitting device, the engraved region has the shape of a line. Preferably, the engraving depth of the engraved region is 0.5 μm or more but 50 μm or less. Advisably, it is preferable that the distance from an edge of the engraved region to an edge of the defect-concentrated region is 5 μm or more. Moreover, it is preferable that the ridge portion is so formed as to be located 5 μm or more away from an edge of the engraved region. Furthermore, it is preferable that the width of the engraved region is 3 μm or more but 150 μm or less.

As described above, according to the present invention, when a substrate or a nitride semiconductor layer has a defect-concentrated region and a low-defect region corresponding to a region other than the defect-concentrated region, the nitride semiconductor layer or the substrate is provided, in a predetermined portion thereof, with an engraved region engraved so as to be located lower than the low-defect region. In this way, the growth direction is made uniform and the surface flatness is improved, offering uniform characteristics within a wafer surface. This makes it possible to improve the yield rate.

Moreover, by providing an engraved region, it is possible to release the strains present within the nitride semiconductor layer and thus suppress development of cracks.

It is to be noted that, in the present specification, a negative index indicating a crystal plane or direction is represented by its absolute value headed with a negative symbol "−" instead of overscoring the figure as conventionally practiced in crystallography, because it is impossible to do so herein.

Used as a substrate in the present invention may be a GaN substrate in a freestanding state by removing a primer therefrom, as used in the conventional example described earlier, or a GaN substrate just as it is without removing a sapphire primer layer. That is, the following description deals with examples that use a substrate having a defect-concentrated region and a low-defect region on a surface thereof on which a thin film of a nitride semiconductor laser has not yet been grown by MOCVD.

BEST MODE FOR CARRYING OUT THE INVENTION

Hereinafter, embodiments of the present invention will be described with reference to the accompanying drawings.

First Embodiment

Figure 1:
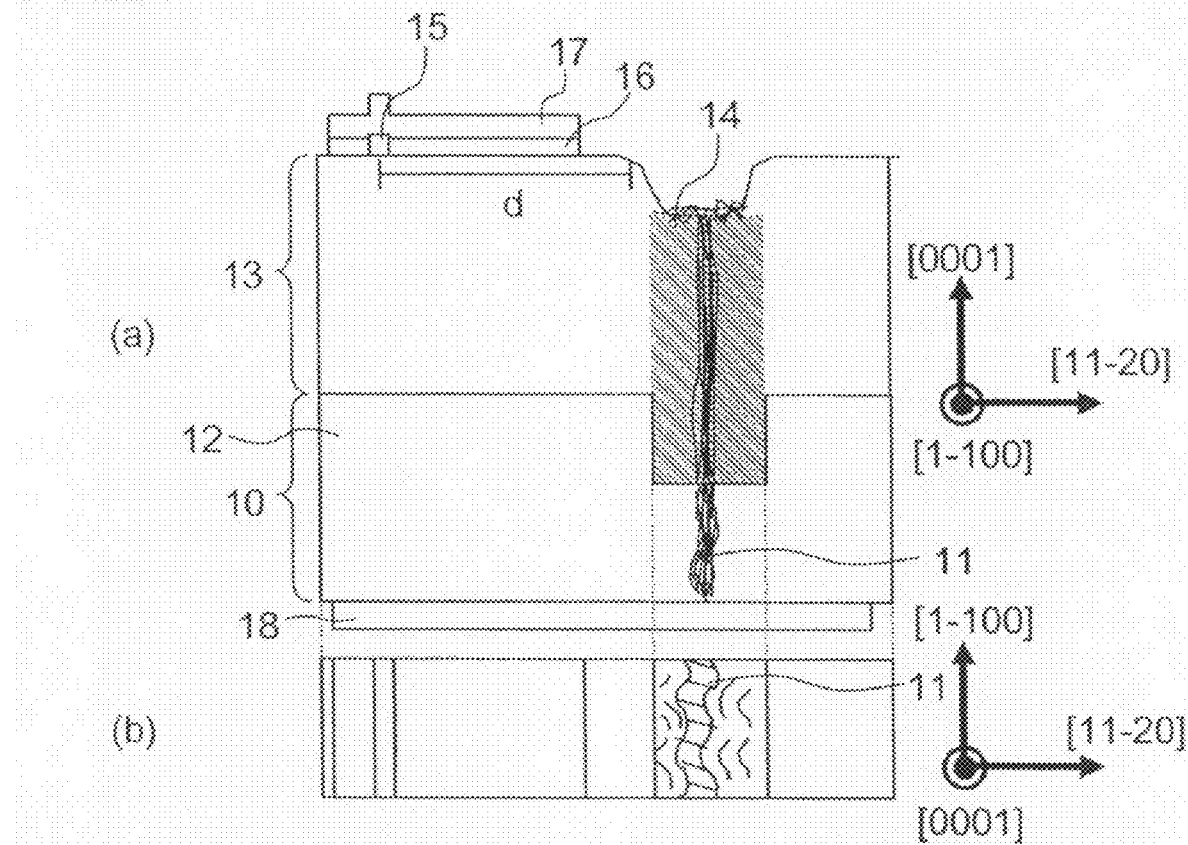
FIG. 1(a) is a sectional view of a nitride semiconductor laser device of a first embodiment.
FIG. 1(b) is a top view of FIG. 1(a)

FIG. 1(a) is a sectional view of a nitride semiconductor laser device, and FIG. 1(b) is a top view of FIG. 1(a). An n-type GaN substrate 10 includes, as a part thereof, a defect-concentrated region 11, all the remaining part thereof being a low-defect region 12.

Note that, in the present specification, a defect-concentrated region denotes a region where, as a result of subjecting a substrate or a nitride semiconductor layer fabricated on a substrate to etching by dipping it in a mixed acid liquid, namely a mixture of sulfuric acid and phosphoric acid, heated to 250° C., many etch pits are observed, attesting to concentration of defects (or dislocations, for example) therein. On the other hand, a low-defect region denotes a region with EPDs (etch pit densities) of the order of $10^4$ to $10^5/cm^2$. The defect-concentrated region has three or more orders of magnitude greater EPDs. The measurement of the EPD can be made possible by the use of gas-phase etching such as RIE (reactive ion etching). Alternatively, suspension of growth in a MOCVD furnace followed by exposure to a high temperature (about 1,000° C.) also makes the measurement of the EPD possible. The measurement itself can be achieved by the use of an AFM (atomic force microscope), CL (cathode luminescence), microscopic PL (photo luminescence), or the like.

On the substrate 10, a nitride semiconductor layer 13 (an epitaxially grown layer) is formed. In the substrate 10, an engraved region 14 is so formed as to include the defect-concentrated region 11. The engraved region 14 is engraved by RIE. Moreover, on the top of the nitride semiconductor layer 13, a ridge portion 15 that serves as a laser light waveguide structure and a $SiO_2$ layer 16 for current constriction are formed, and on top of this, a p-type electrode 17 is formed. Furthermore, on the bottom face of the substrate 10, an n-type electrode 18 is formed.

Note that, in the present specification, the distance from the center of the ridge portion 15 to an edge of the engraved region 14 is represented by d. In FIG. 1(a), it is assumed that d=40 μm.

Figure 2:
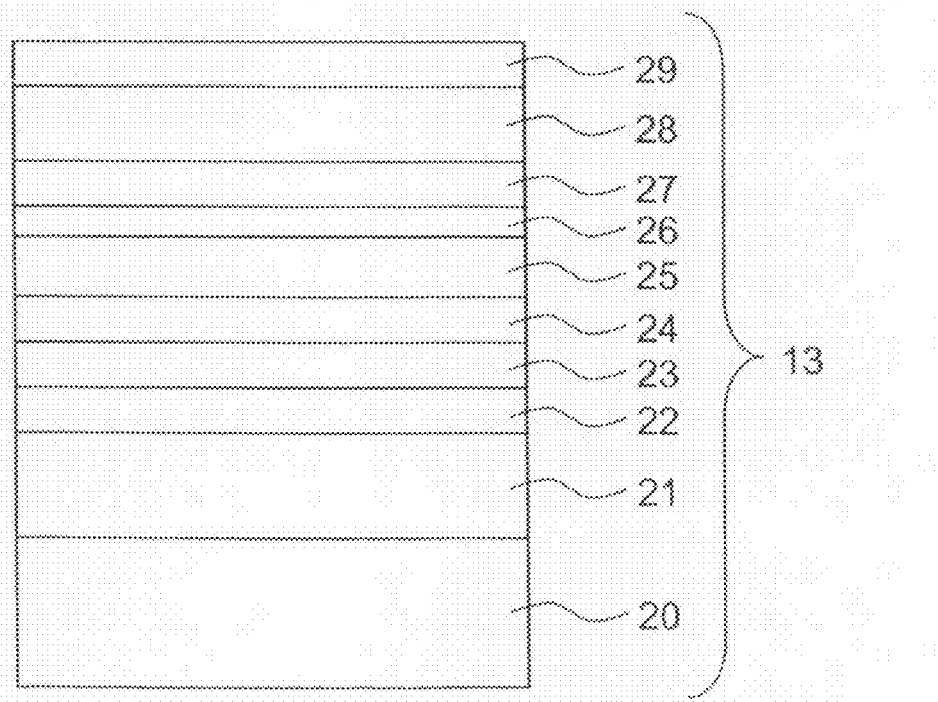
FIG. 2 is a sectional view showing the layer structure of a nitride semiconductor layer.

FIG. 2 is a sectional view showing the layer structure of the nitride semiconductor layer 13. The nitride semiconductor layer 13 has the following layers formed one on top of another in the order mentioned on the surface of an n-type GaN layer 20 (with a film thickness of 3.5 μm): an n-type $Al_{0.062}Ga_{0.938}N$ first clad layer 21 (with a film thickness of 2.3 μm), an n-type $Al_{0.1}Ga_{0.9}N$ second clad layer 22 (with a film thickness of 0.2 μm), an n-type $Al_{0.062}Ga_{0.938}N$ third clad layer 23 (with a film thickness of 0.1 μm), an n-type GaN guide layer 24 (with a film thickness of 0.1 μm), an InGaN/GaN-3MQW active layer 25 (with an InGaN/GaN film thickness of 4 nm/8 nm), a p-type $Al_{0.3}Ga_{0.7}N$ vaporization prevention layer 26 (with a film thickness of 20 μm), a p-type GaN guide layer 27 (with a film thickness of 0.05 μm), a p-type $Al_{0.062}Ga_{0.938}N$ clad layer 28 (with a film thickness of 0.5 μm), and a p-type GaN contact layer 29 (with a film thickness of 0.1 μm).

Figure 3:
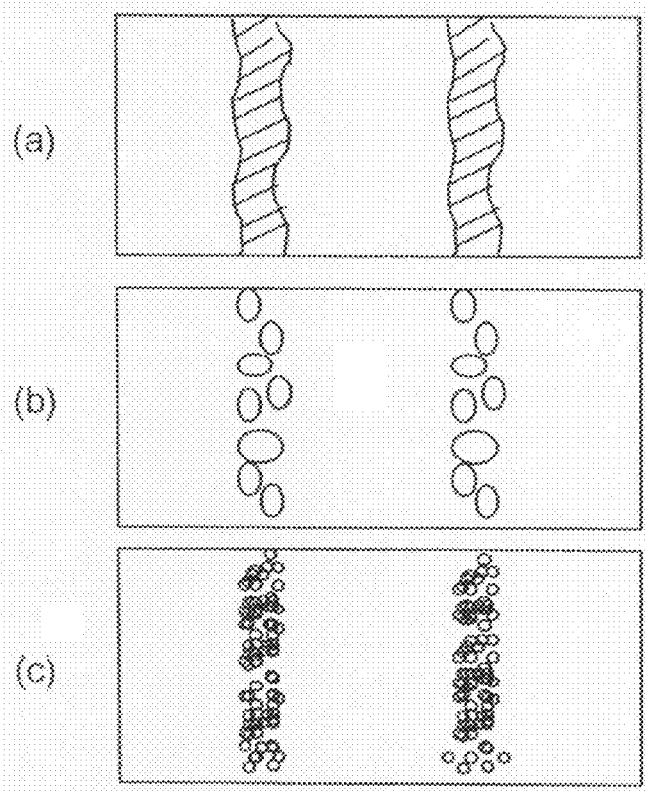
FIG. 3(a) is an enlarged top view showing an example of a defect-concentrated region.
FIG. 3(b) is an enlarged top view showing an example of a defect-concentrated region.
FIG. 3(c) is an enlarged top view showing an example of a defect-concentrated region.

As shown in FIG. 1(b), the line-shaped defect-concentrated region 11 extends in the direction [1-100]. The defects, which are linear as seen from above, may have different shapes depending on their defect density and type. Examples of the shape of the defect-concentrated region are shown in FIGS. 3(a) to 3(c). There are, for example, defect-concentrated regions in the shape of lines (FIG. 3(a)), defect-concentrated regions in the shape of holes, (FIG. 3(b)), and closely-spaced defect-concentrated regions in the shape of fine holes (FIG. 3(c)). The size of the holes and linear cores here is of the order of about 1 nm to several tens of μm. This embodiment deals with a case shown in FIG. 3(a). Note that the same advantages are obtained in cases shown in FIGS. 3(b) and 3(c).

Next, a fabricating procedure will be described. As in the conventional example described earlier, the GaN substrate 10 having defect-concentrated regions in the shape of lines is fabricated through the following procedure. On a sapphire substrate, a 2.5 μm thick primer GaN layer is grown by MOCVD. Then, on top of this, a $SiO_2$ mask pattern having regular stripe-shaped openings is formed (with a period of 20 μm), and then a 15 μm thick GaN layer is formed again by MOCVD to produce a wafer. The film does not grow on $SiO_2$, and thus starts to grow inside the openings. As soon as the film becomes thicker than the $SiO_2$, the film then starts to grow horizontally away from the openings. At the center of every $SiO_2$ segment, different portions of the film growing from opposite sides meet, producing, where they meet, a defect-concentrated region 11 with high defect density. Since the $SiO_2$ is formed in the shape of lines, defect-concentrated regions are also formed in the shape of lines. Here, the width of the defect-concentrated region 11 is about 40 μm, and the defect-concentrated regions 11 are formed at about 400 μm intervals.

Here, the substrate is produced by ELOG. It should be understood, however, that other fabricating methods may be used. Specifically, the only requirement is to use a substrate including a defect-concentrated region and a low-defect region and grow a nitride semiconductor layer on the substrate. The substrate may be a substrate of sapphire, or a substrate of another material, for example, a substrate of SiC, GaN, GaAs, Si, spinel, or ZnO.

Next, all over the surface of the substrate 10, $SiO_2$ or the like is vapor-deposited by electron beam deposition so as to have a thickness of 400 nm. Then, by common photolithography, stripe-shaped windows are formed with photoresist in the direction [1-100] so as to have a width of 60 μm each and include a defect-concentrated region each. Then, by ICP or RIE, the $SiO_2$ and the GaN substrate 10 are etched. The GaN substrate 10 is etched to a depth of 4 μm. Thereafter, the $SiO_2$ is removed with an etchant such as HF. This is the end of the treatment of the substrate to be performed before a nitride semiconductor layer 13 is grown thereon.

Figure 4:
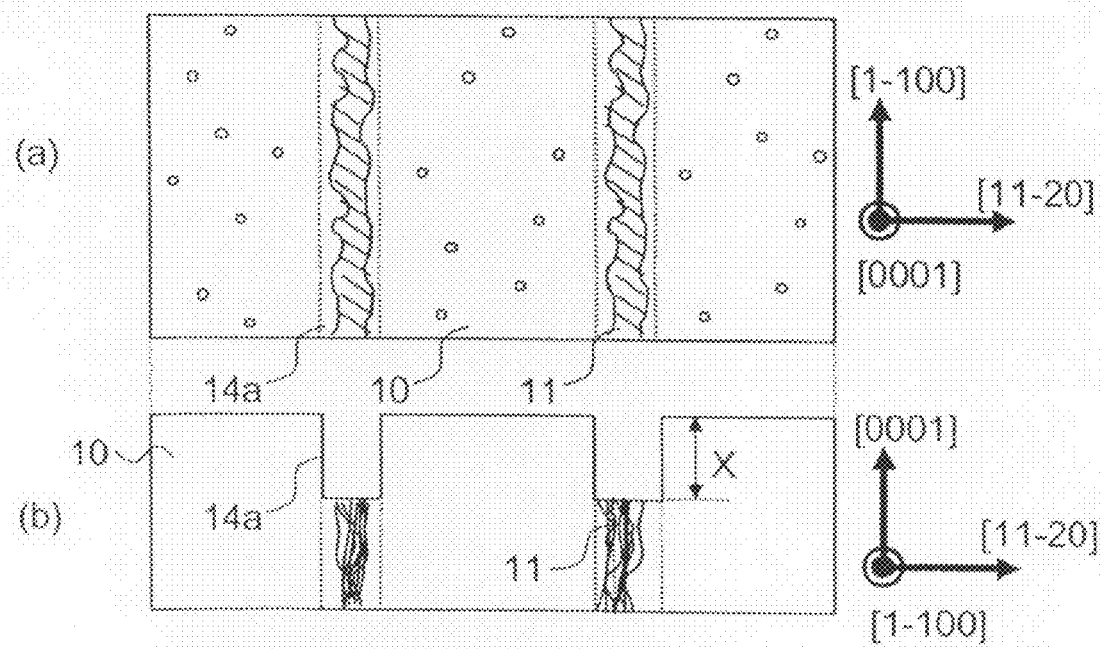
FIG. 4(a) is a top view of a substrate of the first embodiment.
FIG. 4(b) is a sectional view of FIG. 4(a)

FIG. 4 shows the thus obtained substrate 10. FIG. 4(a) is a top view of the substrate 10, and FIG. 4(b) is a sectional view of FIG. 4(a). Reference numeral 14a represents the regions etched by RIE so as to include the defect-concentrated region 11. Symbol X represents the etching depth. In the present specification, the etching may be achieved by the use of gas-phase etching, or by the use of a liquid etchant.

Then, the nitride semiconductor layer 13 is laid on the top of the substrate 10, followed by the formation of the ridge portion 15, the $SiO_2$ layer 16, the p-electrode 17, and the n-electrode 18.

Figure 5:
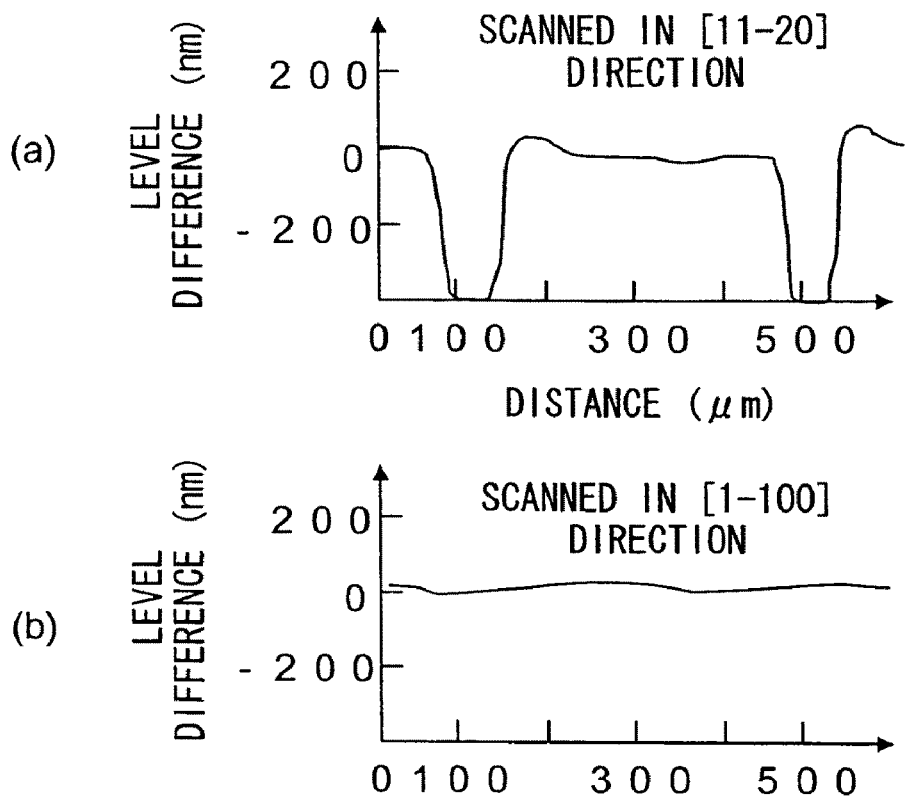
FIG. 5(a) is a diagram showing the surface flatness as measured in the direction [11-20]
FIG. 5(b) is a diagram showing the surface flatness as measured in the direction [1-100]
Figure 16:
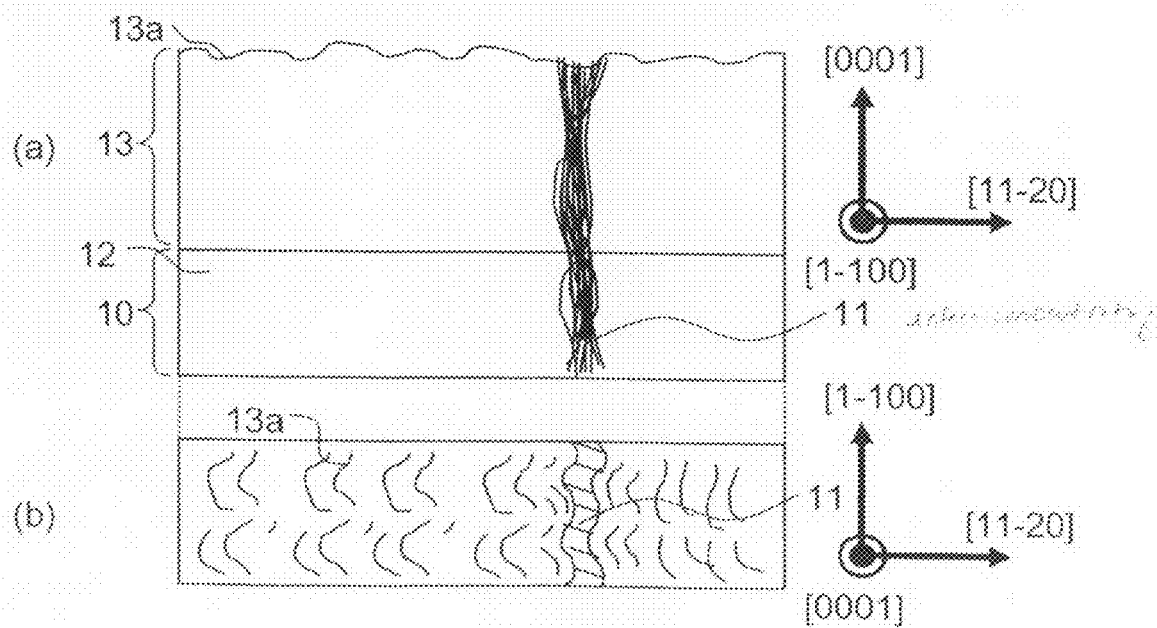
FIG. 16(a) is a sectional view of a conventional semiconductor laser device.
FIG. 16(b) is a top view of FIG. 16(a)
Figure 18:
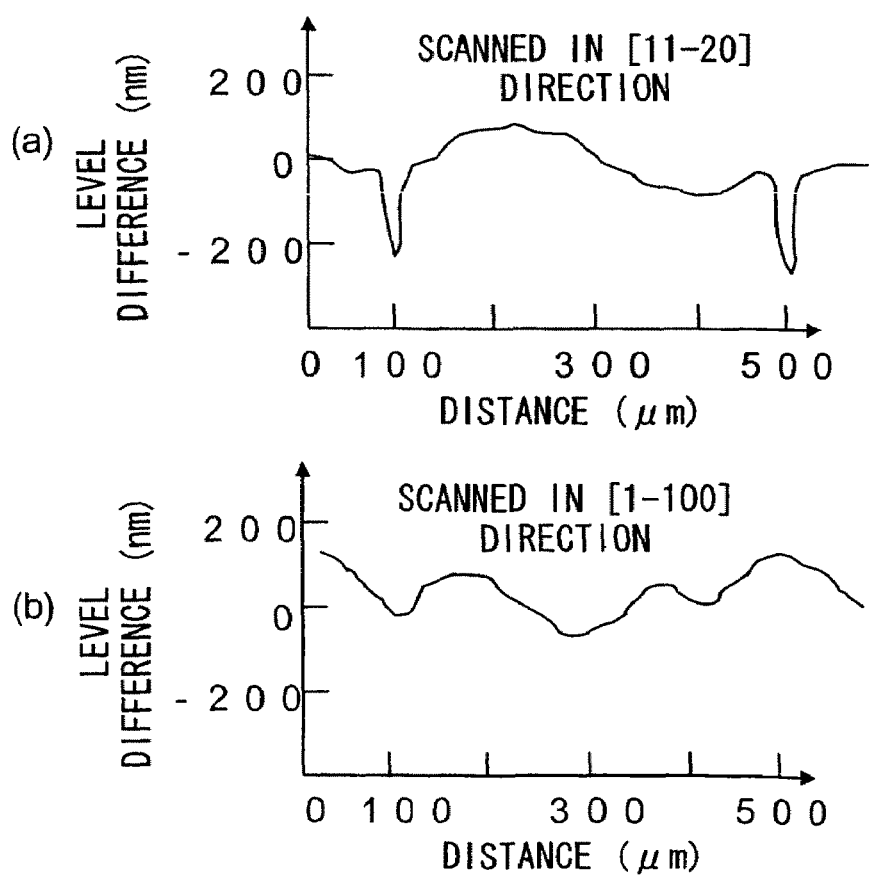
FIG. 18(a) is a diagram showing the surface flatness of a conventional nitride semiconductor laser device as measured in the direction [11-20]
FIG. 18(b) is a diagram showing the surface flatness of a conventional nitride semiconductor laser device as measured in the direction [1-100].

When the defect-concentrated region 11 in the substrate 10 is engraved by RIE, and the nitride semiconductor layer 13 is then laid on the top of the substrate 10, the surface flatness of the engraved region 14 is greatly degraded to the same level of roughness as that of the conventional nitride semiconductor laser device shown in FIG. 16 (see FIG. 18). However, as shown in FIG. 5(b), the level difference between the highest and lowest parts, within the 600 μm wide region, except the engraved region 14, in which the measurement was taken, was found to be 20 nm or less. Here, the drops corresponding to the groove portions shown in FIG. 5(a) are not considered.

Figure 6:
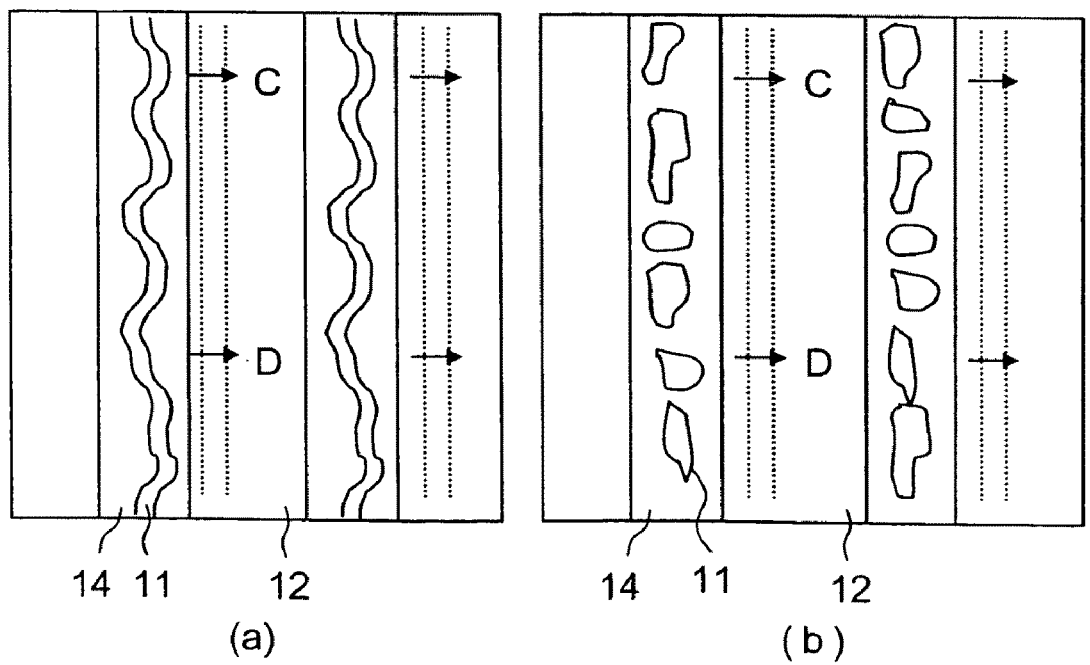
FIG. 6(a) is a top view showing how a nitride semiconductor layer having defect-concentrated regions in the shape of lines grows.
FIG. 6(b) is a top view showing how a nitride semiconductor layer having defect-concentrated regions in the shape of dots grows.
Figure 17:
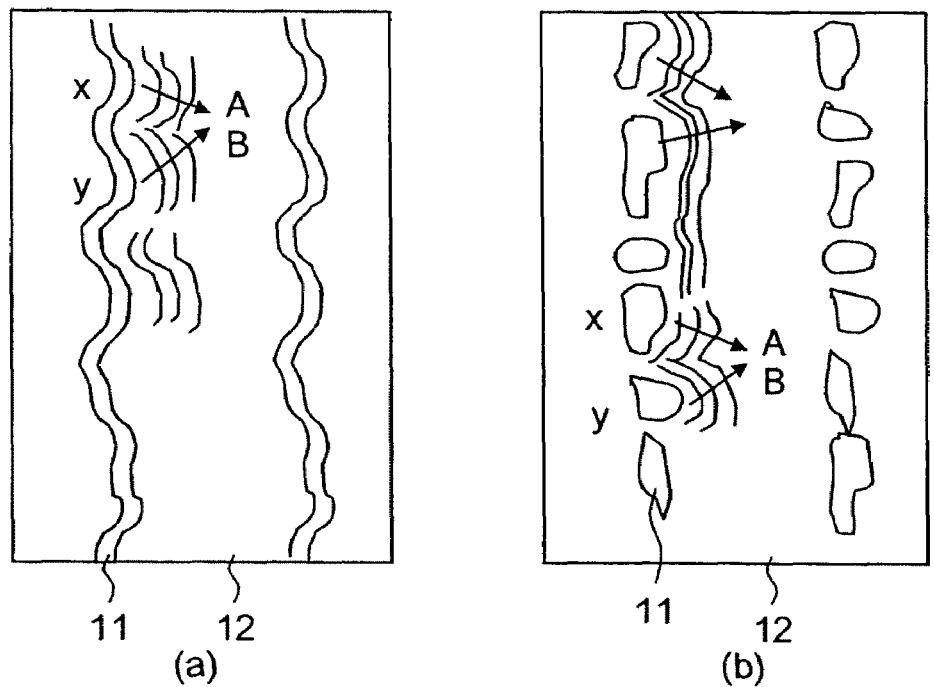
FIG. 17(a) is a top view showing how a conventional nitride semiconductor layer having defect-concentrated regions in the shape of lines grows.
FIG. 17(b) is a top view showing how a conventional nitride semiconductor layer having defect-concentrated regions in the shape of dots grows.

The reasons are explained by using FIG. 6. FIG. 6(a) is a top view showing how the nitride semiconductor layer 13 having the defect-concentrated regions 11 in the shape of lines grows, and FIG. 6(b) is a top view showing how the nitride semiconductor layer 13 having the defect-concentrated regions 11 in the shape of dots grows. Unlike the case in FIG. 17, where the growth direction varies depending on the shape of the defect-concentrated region 11, the formation of the engraved region 14 makes it possible to achieve approximately the same growth direction as indicated by arrows C and D shown in FIG. 6, preventing the growth meet portion from being produced due to the difference in the growth direction. This prevents the thickness of the individual layers from being varied within the surface, making uniform the layer thickness thereof.

Moreover, as shown in FIGS. 6(a) and 6(b), the engraved region 14 makes it possible to achieve the same growth direction within the surface regardless of the shape of the defect-concentrated region 11, and is thus effective in improving the surface flatness.

By forming the ridge portion 15 on the thus obtained extremely flat region, it is possible to suppress the in-surface distribution of the device characteristics and thus improve the yield rate dramatically. The useful lives of the thus obtained semiconductor laser devices were tested with the devices driven under APC at 60° C. and at an output of 30 mW. Here, the useful life is defined as the length of time required for $I_{op}$ (a current value when the optical output is kept at 30 mW) to become 1.5 times the initial level thereof. In the test, the devices emitted at wavelengths of 405±5 nm. From each wafer, 50 semiconductor laser devices were randomly picked out, and the number of devices of which the useful lives exceeded 3,000 hours was counted as the yield rate.

Here, the yield rate was more than 80%. Note that, when the nitride semiconductor layer 13 was grown directly on the substrate 10 shown in the conventional example described earlier, the yield rate was 30% or less. Accordingly, it can be said that better surface flatness of the nitride semiconductor layer 13 (except the engraved region 14) makes uniform the layer thickness and the composition of the individual layers within the wafer surface, leading to better yield rate.

Figure 7:
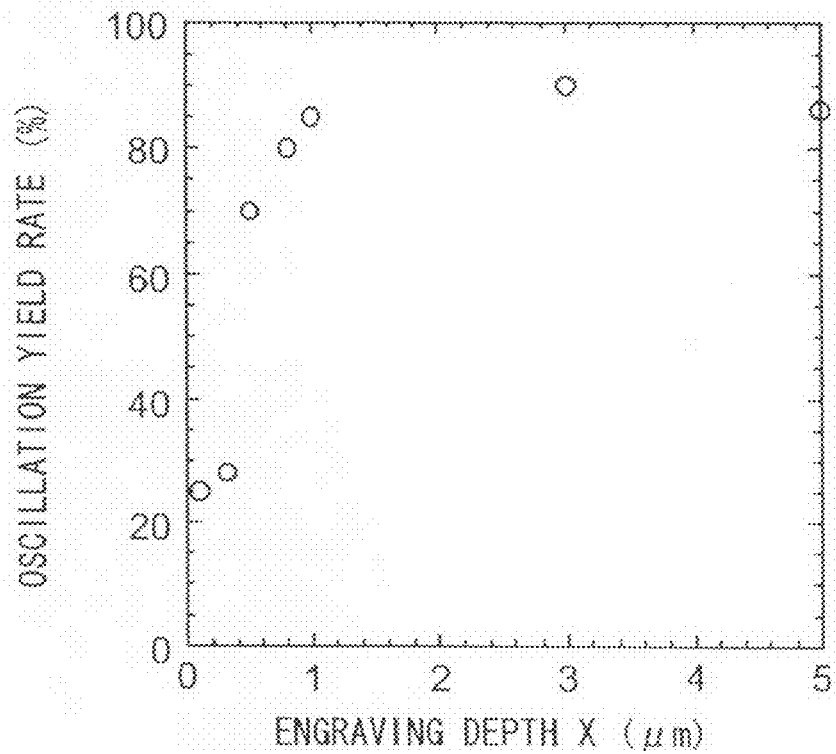
FIG. 7 is a diagram showing the relationship between the depth X of an engraved region and the yield rate.

Now, the depth X of the engraved region 14 shown in FIG. 4 will be explained. FIG. 7 shows the relationship between the engraving depth X and the yield rate. Although FIG. 7 shows an example in which the deepest engraving depth X is 5 μm, the yield rate was found to be more than 80% even when the depth was more than 5 μm. If the engraving depth X is less than 0.5 μm, the engraved region is filled quickly when the primer n-type GaN grows. Thus, the poor surface flatness of the engraved region 14 spreads out of it to degrade the surface flatness of the region outside the engraved region 14. Moreover, it has been found that, if X=50 μm or more, when, in general, in the device separation process, the substrate is polished and ground, cracks or the like develop, resulting in a low yield rate. Hence, it is preferable that the engraving depth X be 0.5 μm or more but 50 μm or less.

Figure 8:
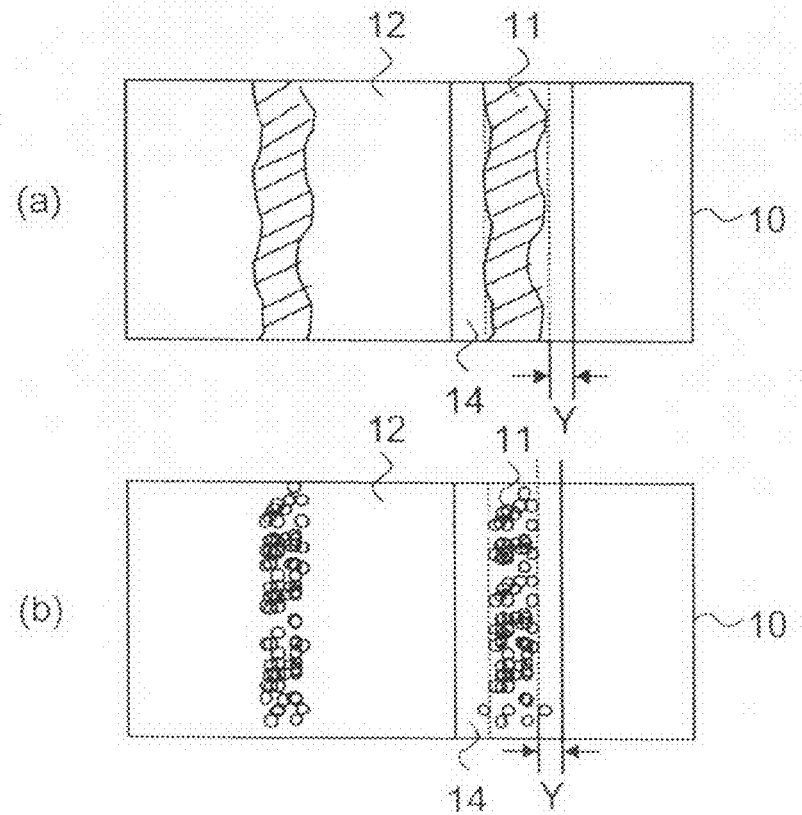
FIG. 8(a) is a top view of a substrate having defect-concentrated regions in the shape of lines.
FIG. 8(b) is a top view of a substrate having defect-concentrated regions in the shape of dots.

Now, the position of the engraved region 14 will be explained. FIG. 8(a) is a top view of the substrate 10 having the defect-concentrated regions in the shape of lines, and FIG. 8(b) is a top view of the substrate 10 having the defect-concentrated regions in the shape of dots. As shown in FIGS. 8(a) and 8(b), the distance from an edge of the defect-concentrated region 11 to an edge of the engraved region 14 is represented by Y. Here, although the distance Y on one side of the defect-concentrated region 11 in the width direction differs from the distance Y on the other side of the defect-concentrated region 11, a shorter one is defined as the distance Y.

Figure 9:
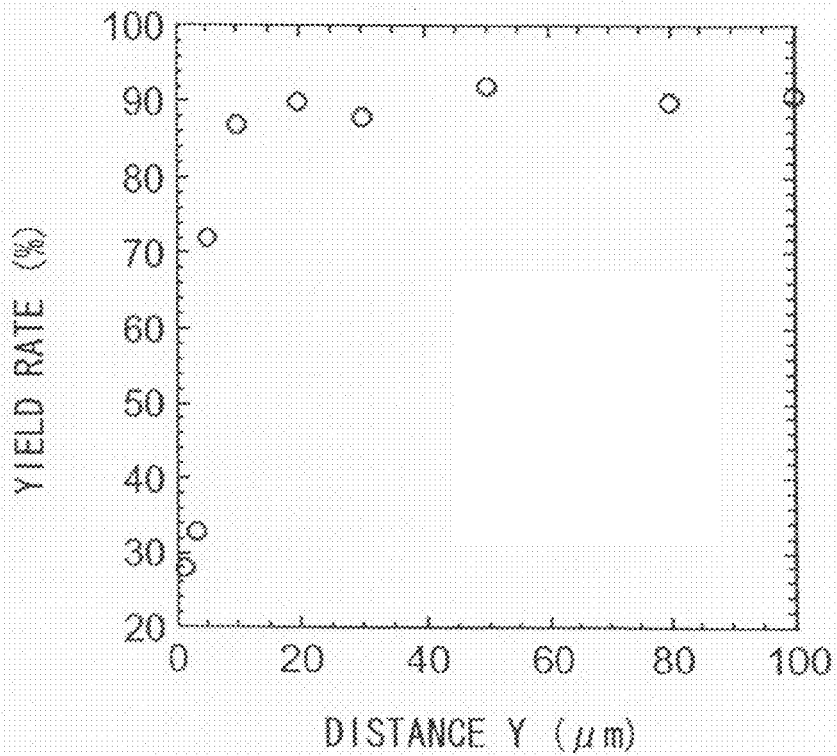
FIG. 9 is a diagram showing the relationship between the distance Y and the yield rate.

FIG. 9 shows the relationship between the distance Y and the yield rate. If the distance Y is less than 5 μm, the engraved region 14 cannot accommodate all the low-crystallinity portions of the defect-concentrated region 11, letting them be outside the engraved region 14, resulting in a low yield rate. Hence, it is preferable that the distance Y be 5 μm or more.

Now, the position of the ridge portion 15 will be explained. The position of the ridge portion 15 is defined by the distance d shown in FIG. 1. If the distance d is less than 5 μm, there appear edge growths (i.e., the growth rate of the edge portions of the unengraved region increases, making the layer thicker), resulting in the variation in the layer thickness. This is undesirable. Hence, no problem arises when the distance d is 5 μm or more.

In the nitride semiconductor laser device shown in the conventional example described earlier, the number of cracks observed per 1 $cm^2$ area on the nitride semiconductor laser device 13 is five to seven. The reason is believed to be strains produced by the differences in lattice constant or in the thermal expansion coefficient between the AlGaN clad layer and the GaN layer included in the nitride semiconductor layer 13.

Such cracks present in a chip greatly affect the characteristics of a nitride semiconductor device, resulting in a low yield rate.

By contrast, in the nitride semiconductor laser device of this embodiment, the number of cracks observed per 1 cm² area is zero. Thus, with this embodiment, it is possible to greatly reduce the number of cracks in the nitride semiconductor layer 13. The reason is believed to be that the strains present within the nitride semiconductor layer 13 are released by the presence of the engraved region 14.

Second Embodiment

This embodiment deals with a case where the defect-concentrated region 11 has the shape of a dot. This embodiment has the same process and configuration, etc. as those of the first embodiment except in that, here, the defect-concentrated region 11 in the substrate 10 has the shape of a dot.

When no engraved region 14 was formed as in the conventional example described earlier, the nitride semiconductor layer 13 grew concentrically away from the defect-concentrated region 11, and the flatness in a growth meet portion was greatly degraded. We then measured the surface roughness, and observed that the level difference between the highest and lowest parts on the surface was as great as 200 nm.

Figure 10:
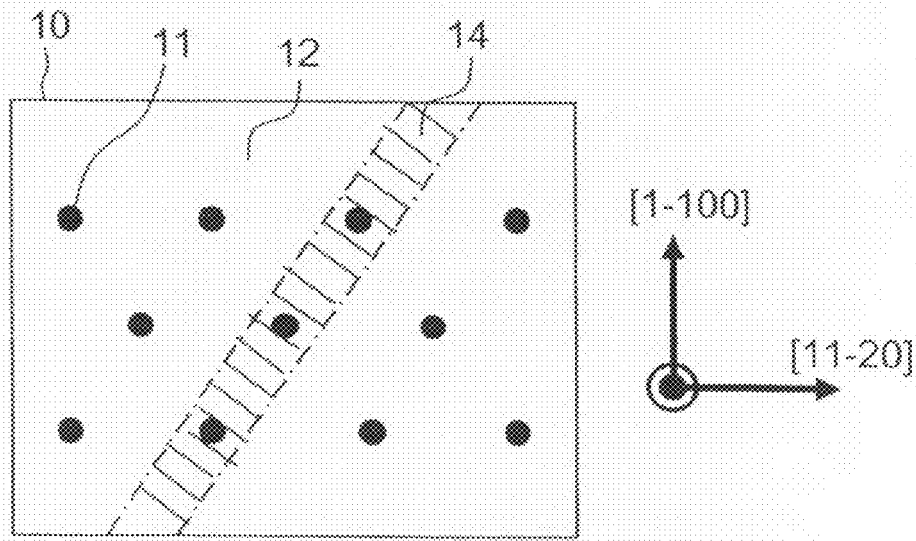
FIG. 10 is a top view of a substrate of a second embodiment having defect-concentrated regions in the shape of dots.

FIG. 10 is a top view of the substrate 10 having the defect-concentrated region 11 in the shape of a dot. By forming the engraved region 14 in the shape of a line so as to include the dot-shaped defect-concentrated regions 11, it is possible to improve the surface flatness.

We measured the surface flatness of the wafer produced in the manner described in the first embodiment, and observed that the level difference between the highest and lowest parts on the surface was 20 nm or less. Moreover, the obtained yield rate was approximately the same as that of the first embodiment. Furthermore, it is preferable that the depth X of the engraved region, the distance Y, and the distance d be made equal to those in the first embodiment.

Third Embodiment

In this embodiment, a substrate having a depression is used. This depression may be formed elsewhere than in the defect-concentrated region 11. This embodiment has the same process and configuration, etc. as those of the first embodiment except for the substrate to be used.

Figure 11:
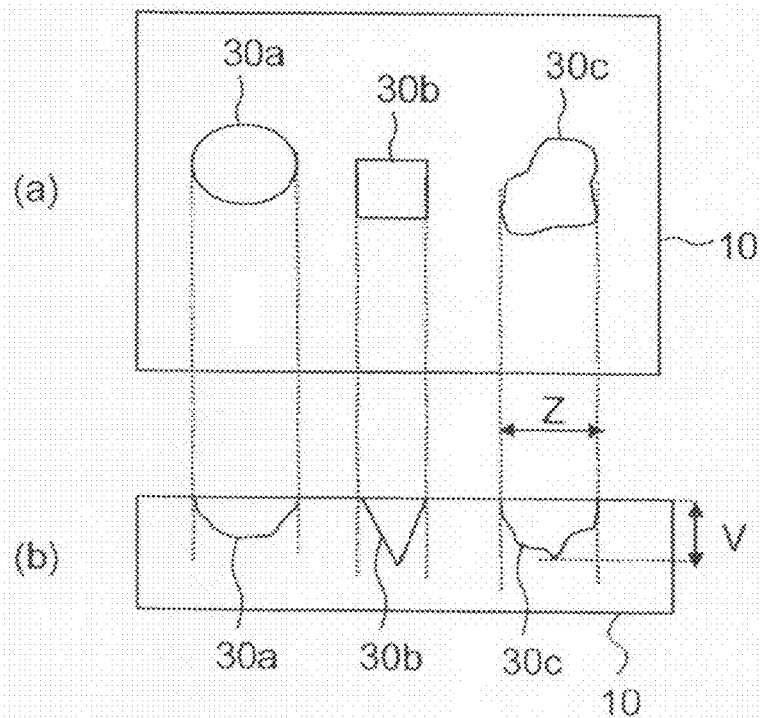
FIG. 11(a) is a top view of a substrate of a third embodiment.
FIG. 11(b) is a sectional view of FIG. 11(a)

The depression can take different shapes. Examples of the shape of the depression are shown in FIG. 11. FIG. 11(a) is a top view of the substrate, and FIG. 11(b) is a sectional view of FIG. 11(a). Here, assuming that these depressions 30a to 30c have the width Z and the depth V. Experiments have proved that, if the width Z is 1 µm or more and the depth V is 0.5 µm or more, the growth of the nitride semiconductor layer 13 occurs in different directions according to the shape of the depression. On the other hand, although the depression smaller and shallower than that described above is filled quickly and thus does not affect the growth direction, it degrades the surface flatness.

The region having such a depression is engraved, as in the first embodiment, by the use of gas-phase etching such as RIE. Then, a wafer is produced in the same manner as in the first embodiment. We then measured the surface flatness, and observed that the level difference between the highest and lowest parts on the surface was 20 nm or less. On the other hand, when the nitride semiconductor layer 13 is grown without forming the engraved region 14 as in the conventional example described earlier, the level difference between the highest and lowest parts on the surface was greatly degraded to 200 nm or more.

Moreover, the obtained yield rate was approximately the same as that of the first embodiment. Furthermore, it is preferable that the depth X of the engraved region, the distance Y, and the distance d be made equal to those in the first embodiment.

Fourth Embodiment

In this embodiment, a semiconductor laser device having an engraved region other than the engraved region 14 including the defect-concentrated region 11 will be explained. This embodiment has the same process and configuration, etc. as those of the first embodiment except for the position of the engraved region on the substrate 10.

Figure 12:
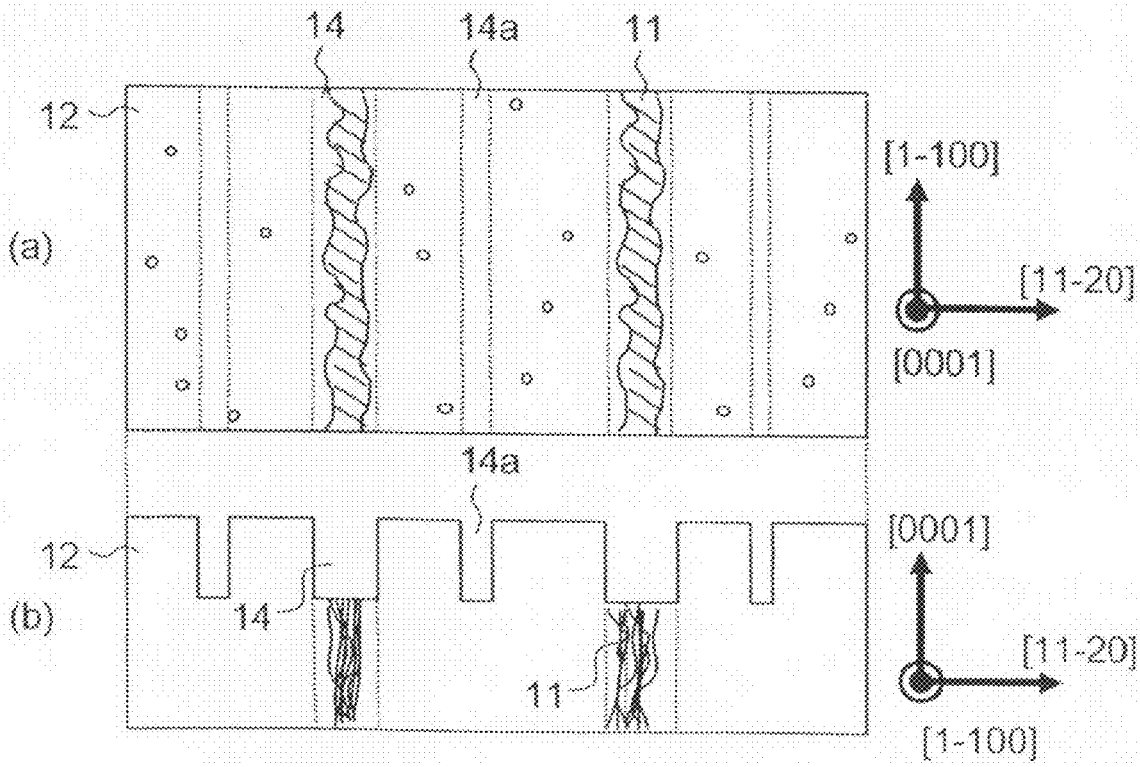
FIG. 12(a) is a top view of a substrate of a fourth embodiment.
FIG. 12(b) is a sectional view of FIG. 12(a)

FIG. 12(a) is a top view of the substrate of the fourth embodiment, and FIG. 12(b) is a sectional view of FIG. 12(a). There exist, as the engraved region, the engraved region 14 including the defect-concentrated region 11 and an engraved region 14a formed in the low-defect region 12.

Figure 13:
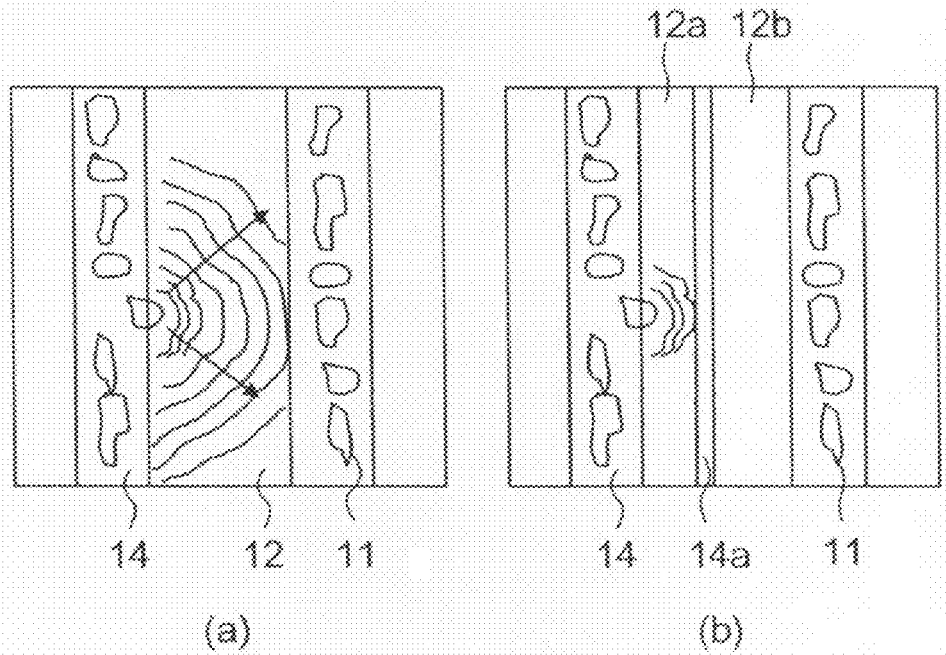
FIG. 13(a) is a top view showing how a nitride semiconductor layer having no engraved region grows.
FIG. 13(b) is a top view showing how a nitride semiconductor layer having an engraved region grows.

The engraved region 14a is provided for the purpose of preventing, when an abnormal growth portion such as a region where defects or growth surfaces are different than elsewhere is included in the low-defect region, such a portion from affecting a widespread area. FIG. 13(a) is a top view showing how the nitride semiconductor layer 13 having no engraved region 14a grows, and FIG. 6(b) is a top view showing how the nitride semiconductor layer 13 having the engraved region 14a grows. As shown in FIG. 16(a), when there exists an irregular defect or the like in the low-defect region 12, abnormal growth occurs there, because there is no engraved region, and then spreads over the low-defect region 12. However, it has been found that, by forming the engraved region 14a also in the low-defect region 12, it is possible to prevent the abnormal growth from spreading out of it as shown in FIG. 16(b). Specifically, the engraved region 14a prevents the abnormal growth occurred in a low-defect region 12a of FIG. 16(b) from spreading out of it, allowing the low-defect region 12b to maintain better surface flatness.

It has been found that the width of the engraved region 14a should be 3 µm or more to prevent the abnormal growth occurred in the low-defect region 12a from spreading out of it into the low-defect region 12b and keep the level difference of the surface flatness to be 20 nm or less. If the width was 3 µm or less, the engraved region 14a was filled, making it impossible to prevent abnormal growth. If the width is 200 µm or more, however, the area of the low-defect region 12 is reduced. This makes narrower the region on which the p-electrode 17 or the like is to be formed, resulting in low process yield. This is undesirable.

For the same reason as stated in the first embodiment, it is preferable that the engraving depth X of the engraved region 14a be 0.5 µm or more but 50 µm or less.

Note that a plurality of engraved regions 14a may be provided between the engraved regions 14, and the same advantage can be achieved by forming them anywhere within the low-defect region.

Fifth Embodiment

This embodiment deals with a case where, instead of engraving the defect-concentrated region 11 by the use of etching such as RIE, engraved regions are formed on both sides of the defect-concentrated region 11 to improve the surface flatness of the nitride semiconductor layer 13, achieving greatly improved in-surface yield rate of the characteristics of a semiconductor laser device. This embodiment has the same process and configuration, etc. as those of the first embodiment except for the position of the engraved region on the substrate 10.

FIG. 14(a) is a top view of the substrate of the fifth embodiment, and FIG. 14(b) is a sectional view of FIG. 14(a). Here, engraved regions 14b are provided on both sides of the defect-concentrated region 11. For example, the width of the engraved region 14b can be set to 20 μm and the depth thereof at 3 μm. Reference numeral 175 represents a low-defect region between the engraved regions 14b, and is referred to as a ridge portion formation region. The ridge portion formation region is a region where a ridge portion that serves as a light waveguide region formed on the top of the nitride semiconductor layer 13 grown on the substrate 10 for the purpose of producing a nitride semiconductor laser device.

Figure 14:
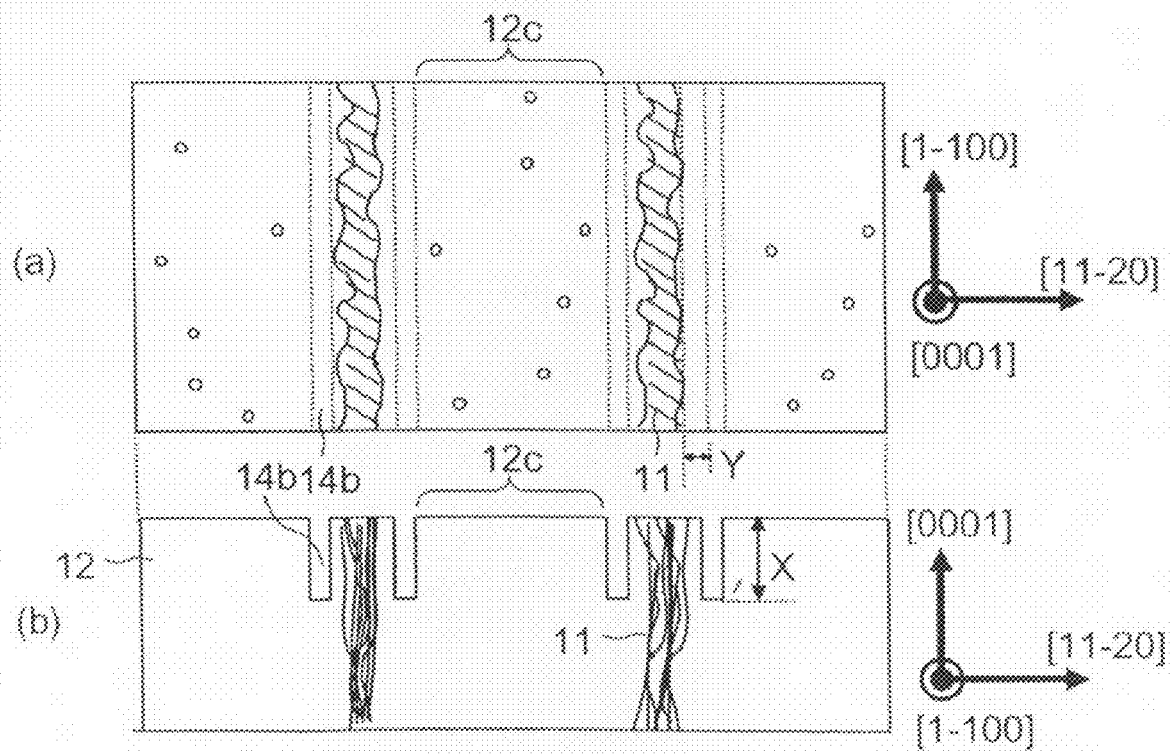
FIG. 14(a) is a top view of a substrate of a fifth embodiment.
FIG. 14(b) is a sectional view of FIG. 14(a)
Figure 15:
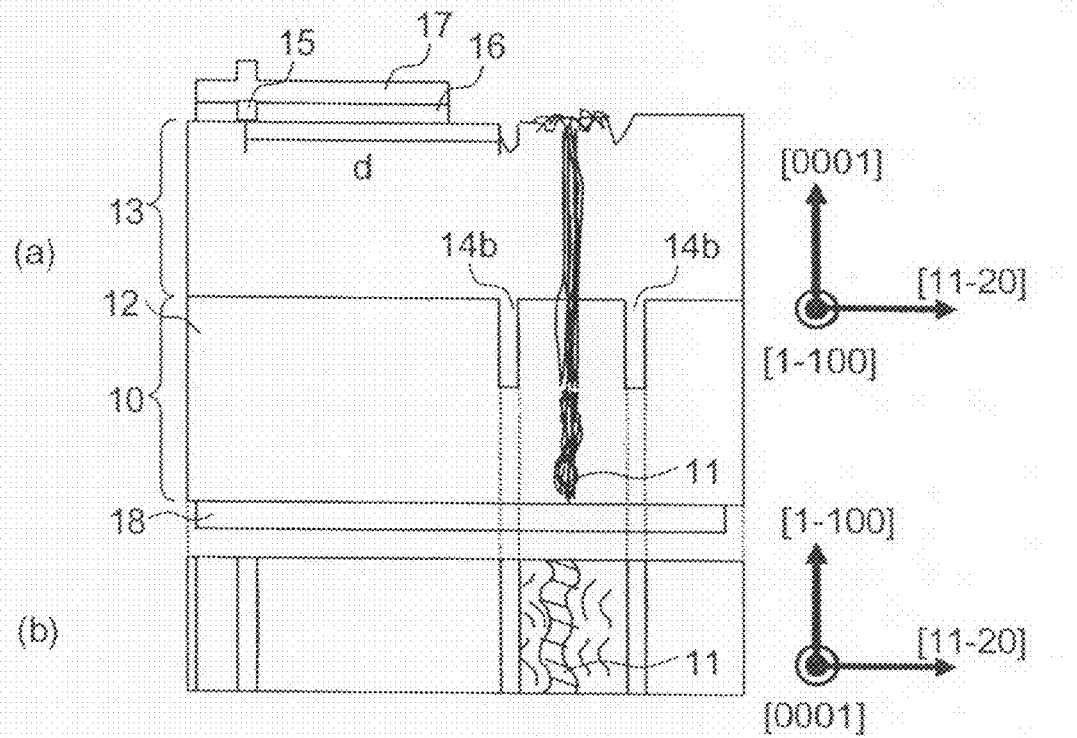
FIG. 15(a) is a sectional view of a nitride semiconductor laser device of the fifth embodiment.
FIG. 15(b) is a top view of FIG. 15(a)

On the substrate 10 of FIG. 14, the nitride semiconductor layer 13 is epitaxially grown. Then, a nitride semiconductor laser device is fabricated on the thus obtained wafer. FIG. 15(a) is a sectional view of the nitride semiconductor laser device of the fifth embodiment, and FIG. 15(b) is a top view of FIG. 15(a). Also here, just as in FIG. 1(a), the distance from the center of the ridge portion 15 to an edge of the engraved region 14b is represented by d, and d=100 μm.

When, as in this embodiment, the engraved regions 14b are provided on both sides of the defect-concentrated region 11 in the substrate 10, and the nitride semiconductor layer 13 is grown on the substrate 10, the surface flatness of a region that includes the defect-concentrated region 11 and is sandwiched between the engraved regions 14b is greatly degraded.

However, even after the nitride semiconductor layer 13 was epitaxially grown, the level difference between the highest and lowest parts, within the 600 μm wide region in which the surface flatness of the ridge portion formation region 12c shown in FIG. 14 was measured, was found to be 20 nm or less. The reason is believed to be that, with action similar to the engraved region 14a of FIG. 13, an abnormal growth region can be prevented from spreading. Thus, it has been found that it is possible to improve the surface flatness by forming the engraved region 14b in the low-defect region 12 so as to include the defect-concentrated region 11 without having to engrave the defect-concentrated region 11. With this engraved region, it is possible to suppress the in-surface distribution of the device characteristics and thus improve the yield rate dramatically.

Moreover, the obtained yield rate was approximately the same as that of the first embodiment. Furthermore, it is preferable that the depth X of the engraved region, the distance Y, and the distance d be made equal to those in the first embodiment.

Moreover, to keep the level difference of the surface flatness to be 20 nm or less, it is preferable that the width of the engraved region 14b be 3 μm or more but 150 μm or less. If the width is 3 μm or less, the engraved region 14b is filled, making the abnormal growth in the defect-concentrated region 11 spread into the low-defect region 12. If the width is 150 μm or more, however, the area of the low-defect region 12 is reduced. This makes narrower the region on which the p-electrode 17 or the like is to be formed, resulting in low process yield. This is undesirable.

Furthermore, in the nitride semiconductor laser device of this embodiment, the number of cracks observed per 1 $cm^2$ area is zero. Thus, with this embodiment, it is possible to greatly reduce the number of cracks in the nitride semiconductor layer 13 for the same reason as stated in the first embodiment.

INDUSTRIAL APPLICABILITY

A nitride semiconductor light-emitting device according to the present invention can be used effectively, especially in a nitride semiconductor laser device.

The invention claimed is:

1. A nitride semiconductor light-emitting device, comprising:
   a substrate; and
   a nitride semiconductor layer laid on a top of the substrate,
   wherein the substrate has a defect-concentrated region and a low-defect region corresponding to a region other than the defect-concentrated region,
   wherein there is provided, in the low-defect region, an engraved region engraved so as to be located lower than the low-defect region,
   wherein the nitride semiconductor layer has a ridge portion serving as a laser light waveguide region, and
   wherein the ridge portion is formed above the low-defect region other than the engraved region.

2. The nitride semiconductor light-emitting device according to claim 1, wherein the ridge portion is so formed as to be located 5 μm or more away from an edge of the engraved region.

* * * * *